(12) United States Patent
Udrea et al.

(10) Patent No.: US 8,415,712 B2
(45) Date of Patent: Apr. 9, 2013

(54) LATERAL INSULATED GATE BIPOLAR TRANSISTOR (LIGBT)

(75) Inventors: Florin Udrea, Cambridge (GB); Vasantha Pathirana, Cambridge (GB); Tanya Trajkovic, Cambridge (GB); Nishad Udugampola, Cambridge (GB)

(73) Assignee: Cambridge Semiconductor Limited, Cambridge (GB)

( * ) Notice: Subject to any disclaimer, the term of this patent is extended or adjusted under 35 U.S.C. 154(b) by 763 days.

(21) Appl. No.: 12/648,847

(22) Filed: Dec. 29, 2009

(65) Prior Publication Data

US 2011/0156096 A1    Jun. 30, 2011

(51) Int. Cl.
*H01L 29/739* (2006.01)
*H01L 21/331* (2006.01)

(52) U.S. Cl. ......... 257/141; 257/E29.197; 257/E21.382; 438/135

(58) Field of Classification Search .................. 438/135; 257/141, E29.197, E21.382
See application file for complete search history.

(56) References Cited

U.S. PATENT DOCUMENTS 7,679,160 B2 *    3/2010    Udrea et al. ................... 257/492

* cited by examiner

*Primary Examiner* — Calvin Lee
*Assistant Examiner* — Monica D Harrison (57) ABSTRACT

This invention generally relates to LIGBTs, ICs comprising an LIGBT and methods of forming an LIGBT, and more particularly to an LIGBT comprising a substrate region of first conductivity type and peak dopant concentration less than about $1 \times 10^{17}/cm^3$; a lateral drift region of a second, opposite conductivity type adjacent the substrate region and electrically coupled to said substrate region; a charge injection region of the first conductivity type to inject charge toward said lateral drift region; a gate to control flow of said charge in said lateral drift region; metal enriched adhesive below said substrate region; and an intermediate layer below said substrate region to substantially suppress charge injection into said substrate region from said metal enriched adhesive.

48 Claims, 9 Drawing Sheets

FIG. 1 STATE OF THE ART LIGBT

LATERAL INSULATED GATE BIPOLAR TRANSISTOR (LIGBT)

FIELD OF THE INVENTION

This invention generally relates to Lateral Insulated Gate Bipolar Transistors (LIGBTs), for example in integrated circuits (ICs), and methods of forming an LIGBT.

BACKGROUND TO THE INVENTION

Power devices operated in integrated circuits typically operate with a voltage in the range 20V to 1.2 kV and typically higher than 30V or 50V or so. Power devices typically operate with a current in the range 10 mA to 50 A and typically higher than 0.1 A and smaller than 5 A. Such devices may also be referred to as "high voltage/power devices". These devices are typically capable of delivering from a few mWatts to 1 Watt or even a few tens of Watts of power. Their application may range from domestic appliances, electric cars, motor control, and power supplies to RF and microwave circuits and telecommunication systems.

Lateral devices in integrated circuits have the high voltage/low voltage main terminals (variously called the anode/cathode, drain/source and emitter/collector) and the control terminal (termed the gate or base) placed at the top surface of the device in order to be easily accessible. In addition the back surface is usually electrically connected via a metal enriched epoxy and a lead frame, usually made of copper, to ground. This is referred to as the back terminal. The epoxy is used as a package die attach and is enriched with particles of metal (e.g., silver) to increase its thermal conductivity and allow good thermal dissipation of heat from the silicon device to the package. In power ICs, such devices are often monolithically integrated with CMOS-type or BiCMOS-type low voltage and/or low power circuits and therefore it is desirable that the lateral high voltage devices are CMOS compatible. It is also possible that several high voltage, power devices are integrated within the same chip. (It will be appreciated that terms such as "top" and "bottom", "above" and "below", "lateral" and "vertical", "beneath", and "under" and "over" may be used in this specification by convention and that no particular physical orientation of the device as a whole is implied).

Figure 1:
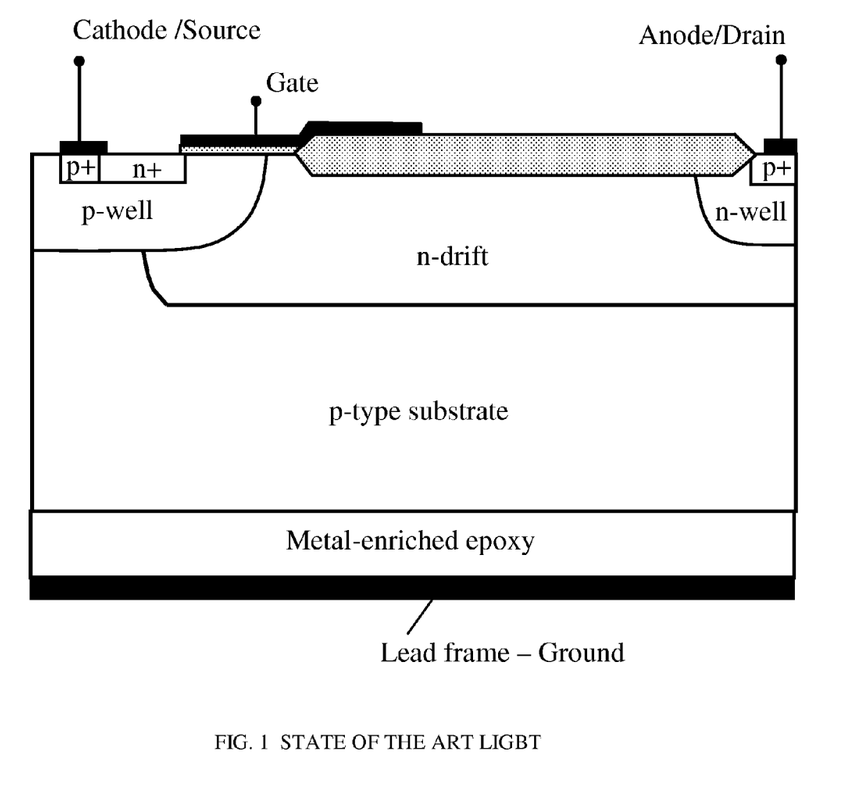
FIG. 1 shows a state of the art LIGBT.

MOS bipolar power devices, such as the lateral insulated gate bipolar transistor (LIGBT) shown in FIG. 1, are based on MOS control with bipolar current conduction in the drift layer and the lowly-doped substrate underneath. Such devices are based on the conductivity modulation concept. At high levels of charge injection, when the current in the device increases, a mobile charge of electrons and of holes is built up in the drift layer, and deep into the substrate region leading to a desirably sharp increase in the conductivity of the drift layer. The mobile charge accumulated, known as plasma, in the on-state dictates the on-state/switching performance of the device given that the plasma must be removed in order to switch the device to the off-state. The plasma level is one to three orders of magnitude higher than the doping level, depending on the current density and the lifetime of the carriers.

Van der Pol et al., Microelectronics Reliability, Volume 39, Issues 6-7, Pages 863-868 (June-July 1999) describes medium power, complementary bipolar devices that have no drift region and whose active transistors are vertically-oriented. Furthermore, a lower, substrate region of the IC does not form a part of the active device—the devices are actually isolated from such lower regions of the IC.

There remains a need for an LIGBT having improved characteristics, for example proper functioning, lower losses and/or faster switching over a wider range of operating conditions (e.g., any combination of one or more predetermined range of continuous and/or switching current between main terminals, voltage between main terminals, junction and/or ambient temperature, etc.).

For use in understanding the present invention, the following disclosures are referred to:

U.S. Pat. No. 7,381,606 (corresponding to application U.S. Ser. No. 11/783,966, which is related to application U.S. Ser. No. 11/133,455 (U.S. Pat. No. 7,301,220)), F. Udrea, Cambridge Semiconductor Ltd., published Mar. 20, 2008;

WO-A-02/25700, Udrea, Cambridge Semiconductor Ltd., published 2006 Mar. 2;

U.S. Pat. No. 6,703,684, Udrea, Cambridge Semiconductor Ltd., published Apr. 11, 2002;

US-A-2004-0084752, Udrea, Cambridge Semiconductor Ltd., published May 6, 2004;

US-A-2004-0087065, Udrea, Cambridge Semiconductor Ltd., published May 6, 2004;

Microelectronics Reliability Vol. 39, Issues 6-7, June-July 1999, Pages 863-868, European Symposium on Reliability of Electron Devices, Failure Physics and Analysis, J. A. van der Pol et al.

SUMMARY

According to a first aspect of the present invention, there is provided an LIGBT comprising: a substrate region of first conductivity type and peak dopant concentration less than about $1\times10^{17}/cm^3$; a lateral drift region of a second, opposite conductivity type adjacent the substrate region and electrically coupled to said substrate region; a charge injection region of the first conductivity type to inject charge toward said lateral drift region; a gate to control flow of said charge in said lateral drift region; metal enriched adhesive below said substrate region; and an intermediate layer below said substrate region to substantially suppress charge injection into said substrate region from said metal enriched adhesive. The suppression of charge injection into said substrate region may be from a Schottky barrier between said substrate region and said metal enriched adhesive. In the complete absence of the intermediate layer, such a Schottky barrier may be formed by contact between the substrate region and said metal enriched adhesive.

The following paragraphs describe optional features, which may be applied in any combination in this or any of the other aspects of the invention described herein.

The substrate region may be a region doped differently from surrounding regions, e.g., the drift region, formed monolithically within the same wafer substrate. The preferred substrate region doping level may depend on application-specific requirements concerning, e.g., required withstand voltage, price of wafers (both higher for lower doping) and so on. More preferred peak doping concentrations of the substrate region are less than $1\times10^{16}/cm^3$, e.g., about $1\times10^{14}/cm^3$ to about $1\times10^{15}/cm^3$.

The drift region as shown in the drawings is above the substrate region.

The charge injection region, which may be connected directly to a terminal on a surface of the LIGBT body, may be a p+ region, and/or may be located in a well, e.g. n-well.

The LIGBT may further have a semiconductor well region within which a region of said second conductivity type may be formed. The charge flow control may control conductivity in a channel region between the drift region and such a region of said second conductivity type within the semiconductor well region.

The adhesive below the substrate region refers generally to the LIGBT in use with the anode, cathode and gate terminals on the top, and does not imply orientation of the device as a whole (as earlier clarified). Moreover, and as described in more detail below, the adhesive, e.g. epoxy, may be attached to the substrate region directly or via one or more intervening layers/regions such as a semiconductor layer of the same conductivity type but more highly doped than the substrate region, a metal layer, an insulating layer and/or dielectric layer. (As for all instances of "attached" in this specification, the attachment is preferably direct or, less preferably, indirect, e.g., via intervening layers and/or regions).

The suppression may suppress (reduce or completely prevent) the charge injection as such into the substrate region and/or may suppress formation of a Schottky barrier between said substrate region and said metal enriched adhesive. For example, the suppression may reduce depletion region width and/or energy barrier height of a Schottky contact so that the contact becomes nonrectifying or even substantially (preferably completely) ohmic. Suppression of charge injection as such may be achieved by trapping charge from the adhesive before the charge reaches the substrate region, e.g., by recombination in a highly doped region adjacent the adhesive, or by blocking charge from reaching the substrate region, e.g., by using an electrically insulating layer. Suppression of formation of a Schottky barrier as such may be achieved by using an electrically insulating or metal layer, and/or by appropriate doping of a semiconductor layer between substrate region and the adhesive. In the case of using a metal layer as the intermediate layer, the metal preferably has work function relative to the substrate region to provide a nonrectifying contact as further described below, in particular as described in relation to the third aspect.

The suppression may inhibit action or presence of a parasitic thyristor comprising such a Schottky contact.

The suppression of charge injection and/or Schottky barrier formation may be achieved in at least one predetermined mode or all modes of operation of the LIGBT. The 'all modes' may comprise all (e.g., 1 or more) modes of operation of the LIGBT required by the intended application of the LIGBT. Any one or more of these modes(s) may cover a predetermined range of operating conditions defined by, e.g., any one or more predetermined values or ranges of: ambient temperature, junction temperature (e.g. −55 Celsius to 125 Celsius, greater for automotive devices, etc), on-state continuous drift region current (e.g. 10 mA to 50 A), on-state switching (e.g., pulsed) current, switching (e.g., pulsed) voltage and/or continuous forward and/or reverse voltage levels, e.g., between the anode and cathode terminals (e.g. 20 Volts to 1200 V, or higher). Thus, the at least one predetermined mode may be one such mode defining a range or specific value(s) of condition(s). For example, such a mode (which may be the only mode of 'all modes') may be defined by a 20 deg C. ambient temperature and/or, 0.1 A, 0.2 A or 0.5 A of switching or continuous on-state drift region current, which may be a maximum operating current of the LIGBT.

Further in this regard, an LIGBT of or formed by any of the aspects of the invention may be a high power device, for example having at least one operating mode (e.g., the predetermined mode above) with a continuous or switching current in the range 10 mA to 50 A and typically higher than 0.1 A and smaller than 5 A. In any operating mode(s), such a high power device may be capable of delivering from a few (e.g., 1-10) mWatts to 1 Watt or even a few tens of Watts (e.g., 10-50 W or up to 90 W) of power.

'Switching' generally refers to turning on/off conduction of cathode/source-anode/drain current in the device, i.e., of lateral current through the drift region. Thus, switching voltage and switching current of the device may be voltage and current, respectively, existing between the cathode/source and anode/drain when the device is pulsed on, generally under control of the gate voltage.

The electrical coupling between the drift region and substrate region may allow current derived from the charge injection region to flow laterally through both the substrate region and the drift region, to be collected at a charge collection region e.g. a contact region connected to a cathode/source terminal. (The charge injection region may be connected to an anode/drain terminal). Such electrical coupling may generate plasma in the substrate region as well as in the drift region.

("Contact region" throughout this specification is generally a region at a surface of the LIGBT for electrical connection, preferably ohmic, to a terminal having, e.g., a line, wire, bonding pad, etc., and is generally for charge collection from or charge injection into the LIGBT, e.g., may be a charge collection semiconductor region or a charge injection semiconductor region; such a contact region may be the charge injection region of the first conductivity type).

The intermediate layer may comprise a semiconductor layer of the first conductivity type (e.g. about 1 um thick) and having higher peak dopant concentration (e.g., about 1000 times higher) than said substrate region. This may result in the above recombination of carriers with oppositely charged carriers in the semiconductor layer, e.g., recombining electrons from the adhesive (e.g. epoxy) with holes in the semiconductor layer, so capturing the injected electrons. The semiconductor layer is preferably an implanted layer, i.e., doped within the same monolithic substrate in which the substrate region is provided (this may be the case particularly in a bulk silicon device embodiment). For example, the semiconductor layer is a p+ layer formed using a cold implanting process, e.g., involving a quick thermal anneal to avoid melting of metallisation on the device.

The LIGBT may further comprise a metallic layer between said semiconductor layer and said adhesive. The metallic layer may comprise, e.g., gold or platinum; aluminium may be less suitable as this may give a Schottky barrier when in contact with a silicon substrate region having low doping concentration of, e.g., less than $1 \times 10^{17}/cm^3$, though this may be overcome if the aluminium is provided in an alloy.

The intermediate layer may comprise a metallic layer between said substrate region and said adhesive, with or without the above semiconductor layer.

Additionally or alternatively to the semiconductor and/or metallic layer(s), the intermediate layer may comprise an electrically insulating layer, e.g., a dielectric layer, preferably <2 um thick (e.g., 0.1-0.2 um), such as silicon nitride or silicon oxide, the nitride and/or oxide preferably being suitable for low temperature deposition.

The LIGBT may comprise a pnp transistor having an emitter comprising the charge injection region (e.g., p+) connected to an anode terminal, a base of said pnp transistor comprising the drift region (e.g. n−), and a collector region comprising the substrate region (e.g. p−).

The LIGBT may comprise a pnp transistor having an emitter comprising the charge injection region (e.g. p+) connected to an anode terminal, a base of said pnp transistor comprising a well region (e.g., n−), and a collector region comprising the substrate region, wherein said well region is preferably a buffer region of second conductivity type adjacent to the drift region (e.g. n−), said charge injection region located within said buffer region.

Regarding dimensions, the substrate region may be between 50 to 300 micrometers thick. The semiconductor layer may be between 500 nanometers and 5 micrometers in thickness. The insulating layer may have thickness less than 1 micrometer. The thickness of the drift region may be greater than 1 µm and preferably between 3 to 20 µm.

The semiconductor layer is preferably at least 100 times, more preferably at least 1000 times, more highly-doped than the substrate region (e.g. p−), e.g., may have a peak doping concentration higher than $1 \times 10^{16}$ cm$^{-3}$, preferably higher than $1 \times 10^{17}$ cm$^{-3}$.

The insulating layer may comprise an oxide layer (preferably low temperature oxide (LTO), e.g., for depositing at low temperature), a nitride layer and/or a combination of nitride and oxide on a back surface of the substrate region and adjacent to said adhesive.

A corresponding method of designing or substantially preventing a thyristor action in an LIGBT, the LIGBT having the above substrate region, lateral drift region, charge injection region, gate and metal enriched adhesive, may comprise selecting an intermediate layer to, when located below said substrate region, substantially suppress charge injection into said substrate region from said metal enriched adhesive.

There may further be provided an integrated circuit (IC) comprising the LIGBT of the first aspect (preferably having any combination or one or more of the above optional features) and at least one other, preferably CMOS-based, device.

According to a second aspect of the invention, there is provided a method of forming an LIGBT, the LIGBT comprising: a substrate region of first conductivity type and peak dopant concentration less than about $1 \times 10^{17}$/cm$^3$; a lateral drift region of a second, opposite conductivity type adjacent the substrate region and electrically coupled to said substrate region; a charge injection region of the first conductivity type to inject charge toward said lateral drift region; a gate to control flow of said charge in said lateral drift region; and metal enriched adhesive below said substrate region, the method comprising forming an intermediate layer below said substrate region to substantially suppress charge injection into said substrate region from said metal enriched adhesive. The suppression may be of charge injection into said substrate region from a Schottky barrier between said substrate region and said metal enriched adhesive. As for all aspects comprising a said intermediate layer, this layer is between the substrate region and metal enriched adhesive. Where a metal layer is used as the intermediate layer, the metal preferably has a work function relative to that of the substrate region as defined below in relation to the third aspect.

Any one or more feature(s) each corresponding to one of the above optional features of the first aspect may be provided in this aspect in any combination.

Thus, the forming of an intermediate layer may comprise forming as said intermediate layer a semiconductor layer of the first conductivity type and having higher peak dopant concentration than said substrate region, preferably with a metallic layer between said semiconductor layer and said adhesive. Similarly, the forming of an intermediate layer may comprise forming as said intermediate layer a metallic layer between said substrate region and said adhesive, and/or forming as said intermediate layer an electrically insulating layer.

Such an insulating layer may be deposited at wafer level, e.g., after fabricating contact region(s) (e.g. the charge injection region of the first conductivity type) and/or metallization layer(s) (e.g., a terminal) at the top surface of the LIGBT.

The method may comprise adding said semiconductor layer at wafer level, e.g., after fabricating contact region(s) (e.g. the charge injection region of the first conductivity type) and/or metallization layer(s) (e.g., a terminal) at the top surface of the LIGBT. The method may comprise forming the LIGBT in a wafer and adding said semiconductor layer after thinning the wafer.

The method may comprise in the following order, fabricating the semiconductor layer, and fabricating a metallization layer attached to the semiconductor layer.

According to a third aspect of the present invention, there is provided an LIGBT comprising: a substrate region of first conductivity type and peak dopant concentration less than about $1 \times 10^{17}$/cm$^3$; a lateral drift region of a second, opposite conductivity type above the substrate region, adjacent said substrate region and electrically connected to said substrate region; a charge injection region of the first conductivity type electrically coupled to said drift region; a first electrical connection to said charge injection region; a second electrical connection to said drift region to remove charge from said drift region; a gate connection between said first and second electrical connections; an intermediate layer beneath said substrate region; a metal-enriched adhesive layer beneath said intermediate layer; and a reference voltage connection beneath said metal-enriched adhesive layer, wherein said intermediate layer comprises one or more of: an electrically insulating layer; a semiconductor layer of said first conductivity type having a peak dopant concentration greater than a peak dopant concentration of said substrate region; and a layer of metal having a work function relative to a work function of said substrate region to provide a substantially (preferably completely) nonrectifying contact between said substrate region and said layer of metal. Preferably, the nonrectifying contact is substantially and/or completely ohmic.

(Corresponding methods may comprising designing or fabricating an LIGBT having each of the above components of the third aspect, or may be methods of designing or substantially preventing a thyristor action in an LIGBT, the LIGBT having the above components and the method comprising selecting an intermediate layer fulfilling the above criteria).

Where the substrate region is n-type, i.e., the first conductivity type is n-type, the work function of the metal is preferably substantially equal to (e.g., matching) or less than that of the substrate region.

Where the substrate region is p-type, i.e., the first conductivity type is p-type, the work function of the metal is preferably substantially equal to or greater than that of the substrate region.

The following paragraphs describe optional features of this aspect, which may be applied in any combination in any of the other aspects of the invention described herein.

The LIGBT is preferably a bulk silicon device, which may be advantageous for integration with other devices, in particular devices operating at different voltages, e.g. CMOS-based.

The electrical connection between the drift region and substrate region may allow current derived from the charge injection region to flow laterally through both the substrate region and the drift region as described above in relation to electrical coupling in the first aspect.

The first and/or second electrical connection may be a terminal, wire and/or bonding pad; this may further apply where the second electrical connection is coupled to the drift region if via a well/buffer region. The electrical coupling between the charge injection region and drift region may similarly be via an intervening region, e.g., a well/buffer region of the opposite conductivity type relative to that of the charge injection region.

The reference voltage connection, while generally for connection to ground, may in use alternatively be raised or lowered to a different potential.

The metal work function having a desired value relative to the work function of the substrate region may be achieved by selecting a metal having a work function taking into account to an energy band structure of the substrate region before contact with the metal, the structure representing, e.g., work function, electron affinity and/or band gap energy, Fermi level, etc. of the substrate region. The work function of the metal may be about 4-5 eV, e.g., 4.7 eV. Preferably, the work function is selected to (at least substantially) prevent formation of a Schottky barrier or to provide a depletion region that is sufficiently narrow that charge tunnels straight through the depletion region, the path between substrate region and adhesive preferably being ohmic.

A corresponding method forms or designs an LIGBT having the substrate region, the lateral drift region, charge injection region, first electrical connection, second electrical connection and gate connection, by forming or selecting an intermediate layer to provide over the metal-enriched adhesive layer for reference voltage connection, the method comprising one or more of: forming/selecting an electrically insulating material to form said intermediate layer; forming/selecting a semiconductor of said first conductivity type to form the intermediate layer and determining a peak dopant concentration of said semiconductor layer greater than a peak dopant concentration of said substrate region; and forming/selecting a metal (which may be a metal alloy) to form the intermediate layer, the metal having a work function relative to a work function of the substrate region to provide a substantially nonrectifying contact between said substrate region and said layer of metal.

According to a fourth aspect of the invention, there is provided a LIGBT, preferably as a bulk silicon device, comprising: a substrate region of first conductivity type and peak dopant concentration less than about $1\times10^{17}/cm^3$; a lateral drift region of a second, opposite conductivity type above the substrate region; a charge injection region of the first conductivity type; metal enriched epoxy; and a parasitic thyristor having a carrier injection region formable by said charge injection region and a carrier injection region of the second conductivity type formed by said metal enriched epoxy, wherein said substrate region and charge injection region are configured to reduce charge injection from said second type carrier injection region into said substrate region such that the loop gain of the thyristor is less than unity in at least one predetermined operation mode, preferably in all operation modes. Thus, the thryristor, which is comprised of an npn transistor and a pnp transistor in thyristor configuration (see, e.g., FIG. 4) may be inactive or suppressed in such mode(s), loop gain being the sum of the current gain of the parasitic npn transistor, $\alpha_p$, and the current gain $\alpha_n$ of the said pnp transistor. The loop gain <1 generally means that the thyristor loop current is not self-sustaining. Such a parasitic thyristor may in some embodiments actually be formed by said charge injection regions of the first and second conductivity types. (Corresponding methods may comprising designing or fabricating an LIGBT by selecting/forming each of the above components of the fourth aspect, or may be methods of designing or substantially preventing a thyristor action in an LIGBT, the LIGBT having the above components and the method comprising selecting the current gain $\alpha_p$ and/or the current gain $\alpha_n$ to provide the loop gain <1).

For example, the substrate and charge injection region are configured to reduce the charge injection by providing an intermediate layer (e.g., p+ and/or metallic and/or electrically insulating) between them as described previously in relation to the other aspects.

Similarly as described above, the epoxy may be attached to the substrate region, e.g., directly or via one or more intervening layers/regions which may comprise e.g. a semiconductor layer of the same conductivity type but more highly doped than the substrate region, a metal layer, and/or an electrically insulating layer. The 'all modes' of operation may be as described above in relation to the first aspect Where the first conductivity type is p type, the LIGBT may comprise: at least one pnp transistor and a parasitic npn transistor, a said pnp transistor connected (directly or indirectly) to the parasitic npn transistor in a thyristor configuration to form said parasitic thyristor; a die attach formed by said metal enriched epoxy; and said parasitic npn transistor having an emitter-base junction formed by a Schottky contact between the metal-enriched epoxy die attach and the p-type substrate region, wherein the current gain of the parasitic npn transistor is such that the loop gain of said thyristor is less than unity in at least one predetermined operation mode of the LIGBT, preferably in all operation modes.

The Schottky contact may be at an interface between the surface and the attach, the interface forming a Schottky barrier. The die attach may comprise droplet(s) or other amount of thermo-setting silver epoxy for bonding, electrical and/or thermal connection of a wafer substrate surface of the LIGBT to a chip carrier.

The pnp transistor may have an emitter comprising a p type (e.g. p+) region (e.g., the charge injection region of the first conductivity type) connected to an anode terminal, a base of said pnp transistor comprising the n type (e.g. n−) drift region, and a collector region comprising the p type (e.g. p−) substrate region of peak dopant concentration less than about $1\times10^{17}/cm^3$.

The pnp transistor may have an emitter comprising a p region (e.g., p+; e.g., the charge injection region of the first conductivity type) connected to an anode terminal, a base of said pnp transistor comprising a well region (e.g. n−), and a collector region comprising the substrate region (e.g. p−) of peak dopant concentration less than about $1\times10^{17}/cm^3$, wherein said well region is preferably a buffer region of second conductivity type adjacent to the drift region, said charge injection region of the first conductivity type located within said buffer region.

The parasitic npn transistor may have an emitter comprising said metal-enriched epoxy die attach, a base comprising the p type (e.g., p−) substrate region of peak dopant concentration less than about $1\times10^{17}/cm^3$ and a collector comprising the n type (e.g., n−) drift region.

The parasitic npn transistor may have an emitter comprising said metal-enriched epoxy die attach, a base comprising the p type (e.g., p−) substrate region of peak dopant concentration less than about $1\times10^{17}/cm^3$ and a collector comprising an n type (e.g. n−) well region, wherein said well region is preferably a buffer region of second conductivity type adjacent to the drift region, said charge injection region of the first conductivity type located within said buffer region.

The LIGBT may comprise at the back surface of said substrate region adjacent to said metal enriched epoxy a p type (e.g., p+) layer having higher peak dopant concentration than said substrate region.

The p type layer (e.g., p+) having higher peak dopant concentration than said substrate region may be between 500 nanometers and 5 micrometers in thickness.

The p type (e.g., p+) layer having higher peak dopant concentration than said substrate region may be at least 100 times, preferably at least 1000 times, more highly-doped than the substrate region (e.g. p−) said higher dopant concentration preferably higher than $1\times10^{16}$ cm$^{-3}$.

The LIGBT may comprise a metallization layer attached to the p type (e.g., p+) layer having higher peak dopant concentration than said substrate region.

The LIGBT may comprise a (preferably thin) insulating layer such as a oxide layer (preferably low temperature oxide (LTO)), a nitride layer or a combination of a nitride and oxide, on a back surface of the substrate region and adjacent to said epoxy. The insulating layer may be deposited at wafer level, e.g., after contact region(s) (e.g. the charge injection region of the first conductivity type) and metallization layer(s) (e.g., terminal(s) at the top surface of the LIGBT are fabricated. The insulating layer may have thickness less than 1 micrometer.

The sum of the current gain of the above parasitic npn transistor, $\alpha_p$, and the current gain $\alpha_n$ of the said pnp transistor (which may be described as vertical, as shown in the drawings) is preferably less than unity in all operational modes of the LIGBT. More specifically, the current gain of the parasitic npn transistor, $\alpha_p$, may be less than 0.1 and even more preferably below 0.01.

The thickness of the drift region may be greater than 1 µm and preferably between 3 to 20 µm.

There may further be provided an integrated circuit (IC) comprising the LIGBT according to the fourth aspect and at least one other, preferably CMOS-based, device.

According to a fifth aspect of the invention, there is provided a method of forming an LIGBT, the LIGBT comprising: a substrate region of first conductivity type and peak dopant concentration less than about $1\times10^{17}$/cm$^3$; a lateral drift region of a second, opposite conductivity type above the substrate region; a charge injection region of the first conductivity type; and metal enriched epoxy, whereby a parasitic thyristor having a carrier injection region is formable by said charge injection region and a carrier injection region of the second conductivity type formed by said metal enriched epoxy, the method comprising providing an intermediate layer between said substrate region and said second type charge injection region to reduce charge injection from said second type carrier injection region into said substrate region such that the loop gain of the thyristor is less than unity inactive in at least one predetermined operation mode of the LIGBT, preferably in all operation modes. In some embodiments, such a parasitic thyristor is actually formed by the charge injection region of the first conductivity type and that of the second conductivity type.

Any one or more feature(s) each corresponding to one of the above optional features of the fourth aspect may be provided in this aspect in any combination.

For example, the method may comprise: depositing as said intermediate layer an insulating layer such as an oxide layer, a nitride layer and/or a combination of a nitride and oxide, on to a back surface of the substrate region and adjacent to said metal-filled epoxy, wherein the insulating layer is deposited at wafer level, e.g., after contact region(s) (e.g. the charge injection region of the first conductivity type) and metallization layer(s) (e.g., terminal(s)) at the top surface of the LIGBT are fabricated.

The method may comprise forming at the back surface of said substrate region adjacent to said metal enriched epoxy a p type layer (e.g., p+) having higher peak dopant concentration than said substrate region, and comprising adding said p type layer (e.g., p+) having higher peak dopant concentration at wafer level, e.g., after contact region(s) and metallization layer(s) (e.g., terminals) at the top surface of the LIGBT are fabricated.

The method may comprise forming at the back surface of said substrate region adjacent to said metal enriched epoxy a p type layer (e.g., p+) having higher peak dopant concentration than said substrate region, and comprising forming the LIGBT in a wafer and adding said p type layer (e.g., p+) having higher peak dopant concentration after thinning the wafer.

The method may comprise forming at the back surface of said substrate region adjacent to said metal enriched epoxy a p type layer (e.g., p+) having higher peak dopant concentration than said substrate region, and comprising fabricating, in the following order, the p type layer (e.g., p+) having higher peak dopant concentration than said substrate region, and a metallization layer attached to the p type layer (e.g., p+) having higher peak dopant concentration.

The LIGBT of or formed by any of the above aspects of the invention may be a high power device, for example operating with a continuous or switching current in the range 10 mA to 50 A and typically higher than 0.1 A and smaller than 5 A. Such a high power device may be capable of delivering from a few (e.g., 1-10) mWatts to 1 Watt or even a few tens of Watts (e.g., 10-50 W or up to 90 W) of power.

Preferred embodiments are defined in the dependent claims.

BRIEF DESCRIPTION OF THE DRAWINGS

For a better understanding of the invention and to show how the same may be carried into effect, reference will now be made, by way of example, to the accompanying drawings, in which.

DETAILED DESCRIPTION OF PREFERRED EMBODIMENTS

The following describes arrangements falling within the broader aspects of the present invention summarised above, and more specific embodiments.

In an LIGBT device, a rated off-state breakdown of the device may be achieved by appropriate doping levels and dimensions of the drift layer and the substrate region. The presence of a lowly-doped substrate region below the drift region may help to distribute more uniformly the electric field and potential lines within the drift region and hence help to increase the voltage breakdown ability of the device. This is known as the RESURF effect. For an effective RESURF, the substrate region is preferably more lowly-doped than the drift region (e.g., by 5× to 10× times). Nevertheless the presence of an open substrate may have detrimental effects on the switching as plasma is deeply accumulated in the lowly-doped substrate and its removal during turn-off can take a long time and result in high turn-off losses.

Figure 6:
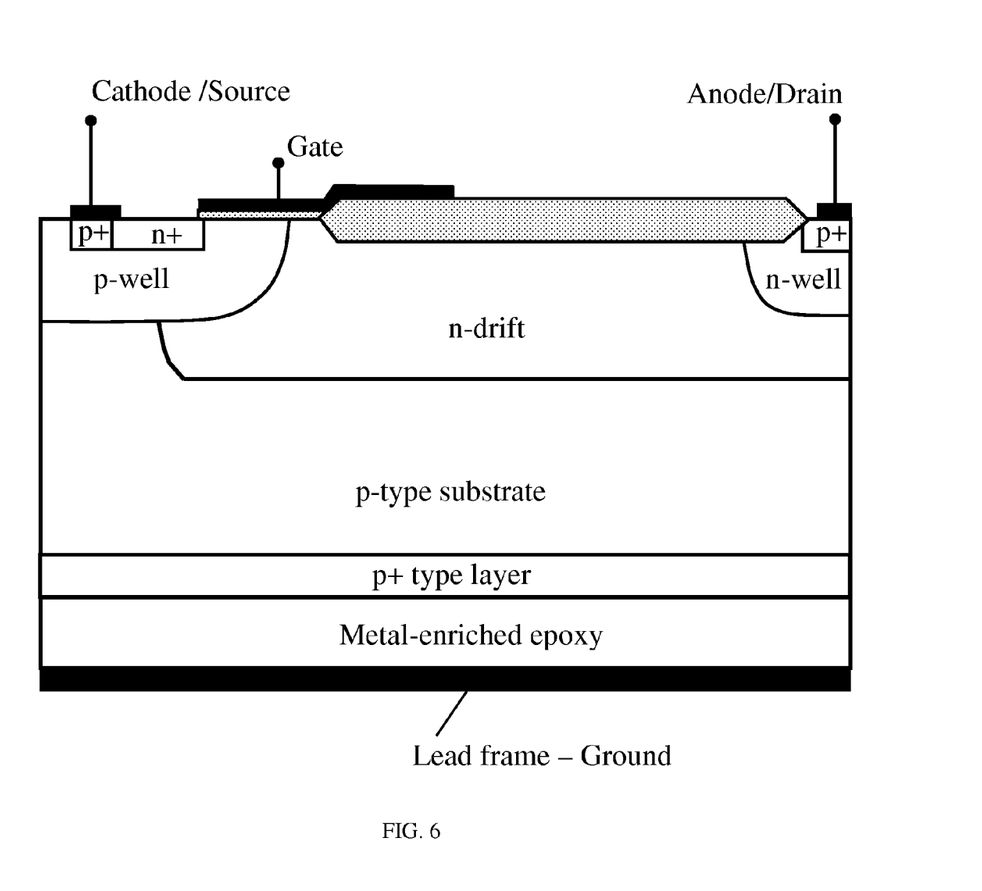
FIG. 6 shows a p+ highly-doped layer added at the back surface of the lowly-doped substrate of the n-channel LIGBT of FIG. 3, adjacent to said metal enriched epoxy.
Figure 7:
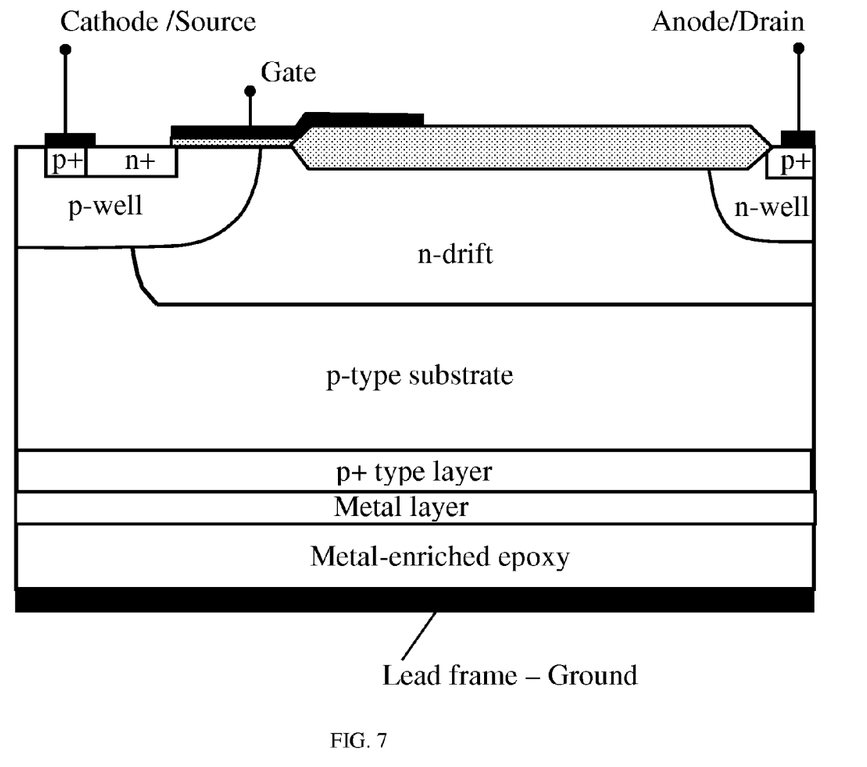
FIG. 7 shows an extra metallization layer added to the n-channel LIGBT of FIG. 6 after the p+ layer is formed.
Figure 9:
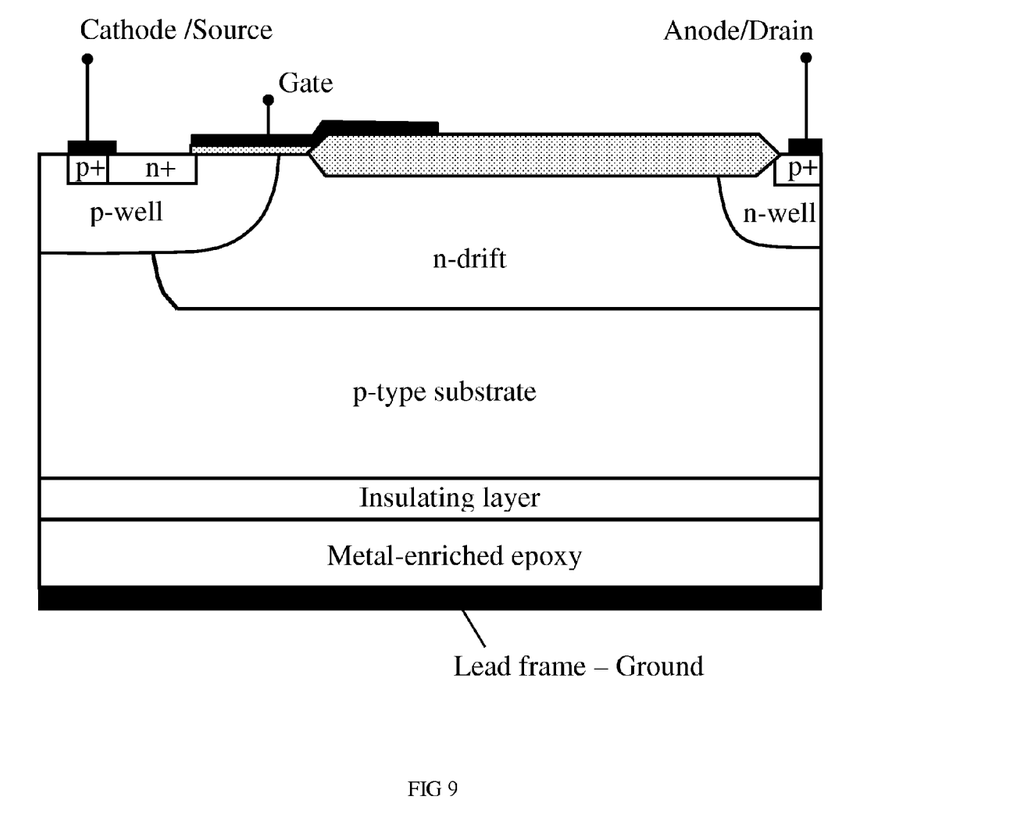
FIG. 9 shows a thin insulating layer deposited onto the back surface of the lowly-doped substrate of the n-channel LIGBT of FIG. 3, adjacent to metal-filled epoxy.

In general, any embodiment of an LIGBT within the scope of the present invention such as those shown in FIGS. 6, 7 and 9, comprises at least two contact regions of a first conductivity type; at least one semiconductor well region; a region of a second, opposite conductivity type located within a said semiconductor well region of said first conductivity type; a lateral drift region of the second conductivity type to conduct charge from a first said contact region towards a second said contact region; and a gate to control conductivity in a channel region between said lateral drift region and said region of said second conductivity type within said semiconductor well region and to thereby control flow of said charge from one of said first and second contact regions to the other of said first and second contact regions.

More specifically, such a LIGBT may be an n-channel or p-channel LIGBT and may comprise: a first contact region of a first conductivity type located within a buffer region of a second conductivity type; a second contact region of said first conductivity type; a source region of said second, opposite conductivity type located within a well region of said first conductivity type and connected electrically to said second contact region; a lateral drift region of the second conductivity type located between the said well region and said buffer region, said lateral drift region to be depleted of mobile carriers during an off-state blocking mode of the LIGBT and able to conduct charge during an on-state conducting mode of the LIGBT; and an insulated gate placed above and in direct contact to said well region, said insulated gate to control charge in a channel region between said lateral drift region and said source region of said second conductivity type and to thereby control flow of charge within the said drift region.

A die attach metal-enriched epoxy may form a Schottky contact or Schottky barrier when in contact with the lowly-doped substrate region. The metal-enriched (metal-filled) epoxy becomes effectively a region of opposite conductivity to that of the lowly-doped substrate region, and may thus allow injection of minority carriers of opposite conductivity type to that of the substrate region when the Schottky contact is forward biased.

When coupled to other regions in the LIGBT, the Schottky contact may lead to the formation of a vertical parasitic thyristor that can slow down the turn-off process and/or introduce additional switching losses and/or, in the worst scenario, lead to latch-up (e.g., resulting in loss of gate control) often followed by thermal failure. (Additionally or alternatively in an LIGBT, other latch-up of LIGBTs may be associated with lateral parasitic thyristors which differ from the above vertical parasitic thyristor).

Embodiments of the invention are particularly concerned with high voltage semiconductor devices which can be used in power integrated circuits and have particular application to MOS-bipolar transistors. More specifically, some embodiments are LIGBTS that are high power devices employing a MOS gate, a drift region and a lateral pnp transistor and, in particular, which may have a lowly-doped substrate region. As understood from the description of embodiments below, advantages of these and other embodiments may include suppression of a parasitic thyristor that may otherwise cause slow switching and/or represent as a reliability hazard.

Any substrate region of an embodiment described herein may comprise a semiconductor such as silicon.

One arrangement of a lateral insulated gate bipolar transistor comprises a lowly-doped substrate region of first conductivity type, a drift region of second conductivity type, placed above the substrate region, a charge injection region of first conductivity type, preferably located within a buffer region of second conductivity type, adjacent to the drift region, a parasitic thyristor, having one of the first type carrier injection regions formed by said charge injection region and the second type carrier injection region formed by a metal enriched epoxy attached to the lowly-doped substrate region and further attached to a package, whereby the injection from said second type carrier injection region is effectively suppressed, such that the thyristor is inactive in all operation modes. In a first embodiment of the arrangement a highly doped layer of first conductivity type is formed by or at least partially within the lowly-doped substrate region adjacent to said metal enriched epoxy. The highly doped layer may have at least either or both of the following two roles, both ultimately suppressing the injection of carriers of second conductivity type from the metal enriched epoxy (for example, n-type semiconductor and electrons being of one conductivity type, and similarly, p-type semiconductor and holes being of another conductivity type, the one and another being opposite): firstly it is acting as a recombination region, effectively 'capturing' the carriers of second conductivity type within it and (ii) it allows to form a more ohmic contact, through tunnelling, as opposed to a Schottky contact to the metal enriched epoxy. In a second embodiment of the arrangement, a thin insulating layer is introduced between the lowly-doped substrate region and the metal enriched epoxy to preferably completely suppress said thyristor.

Figure 2:
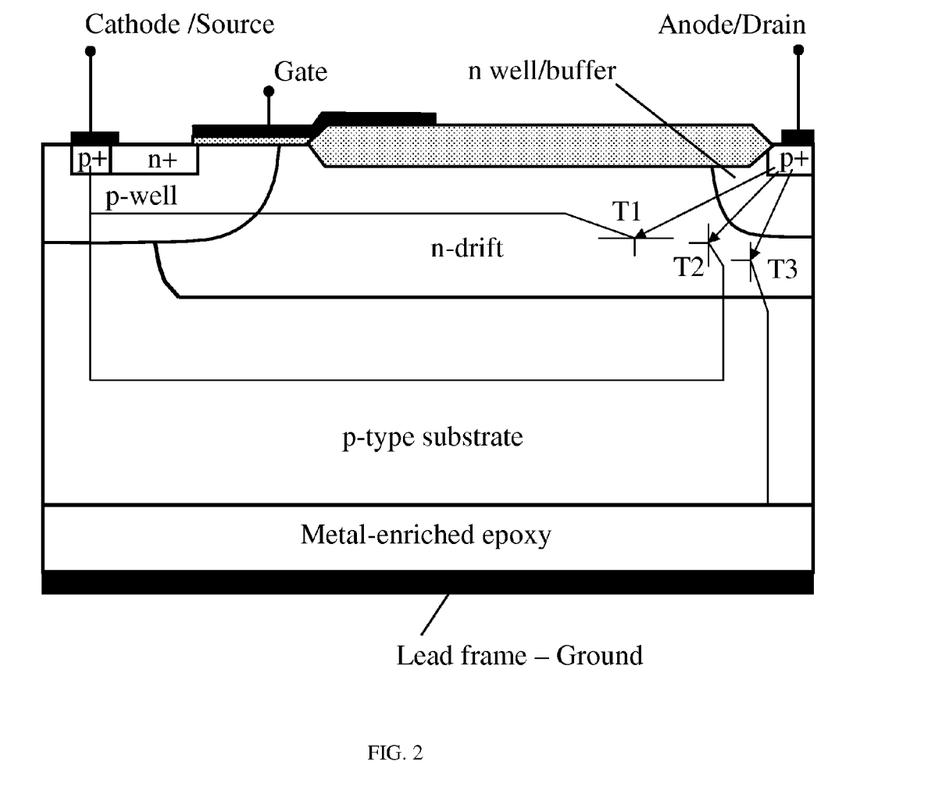
FIG. 2 shows the positions of three pnp transistors (T1, T2 and T3) in an n-channel LIGBT such as that of FIG. 1.

An LIGBT, in the configuration shown in FIG. 1 can be broadly regarded (in terms of an equivalent circuit) as a low voltage MOS component driving three bipolar transistors (i) a wide base (high voltage) bipolar transistor, with the base being formed by the n− drift region, (ii) a narrow base wide collector transistor with the collector being formed by part of the lowly-doped substrate region, the collector terminal being one of the main top surface terminals, and (iii) a narrow base wide collector transistor with the collector being formed by another part of the lowly-doped substrate, the collector terminal being the said back terminal attached to the metal enriched epoxy. By way of example, an n-channel LIGBT has an n-channel MOSFET driving the base of (i) a 'lateral' wide base pnp transistor (ii) a vertical narrow base pnp transistor with collector terminal being one of the main top surface terminals and (iii) a vertical narrow base pnp transistor with collector terminal being the back terminal. The positions of the three pnp transistors (T1, T2 and T3, respectively) are shown schematically in FIG. 2.

Figure 3:
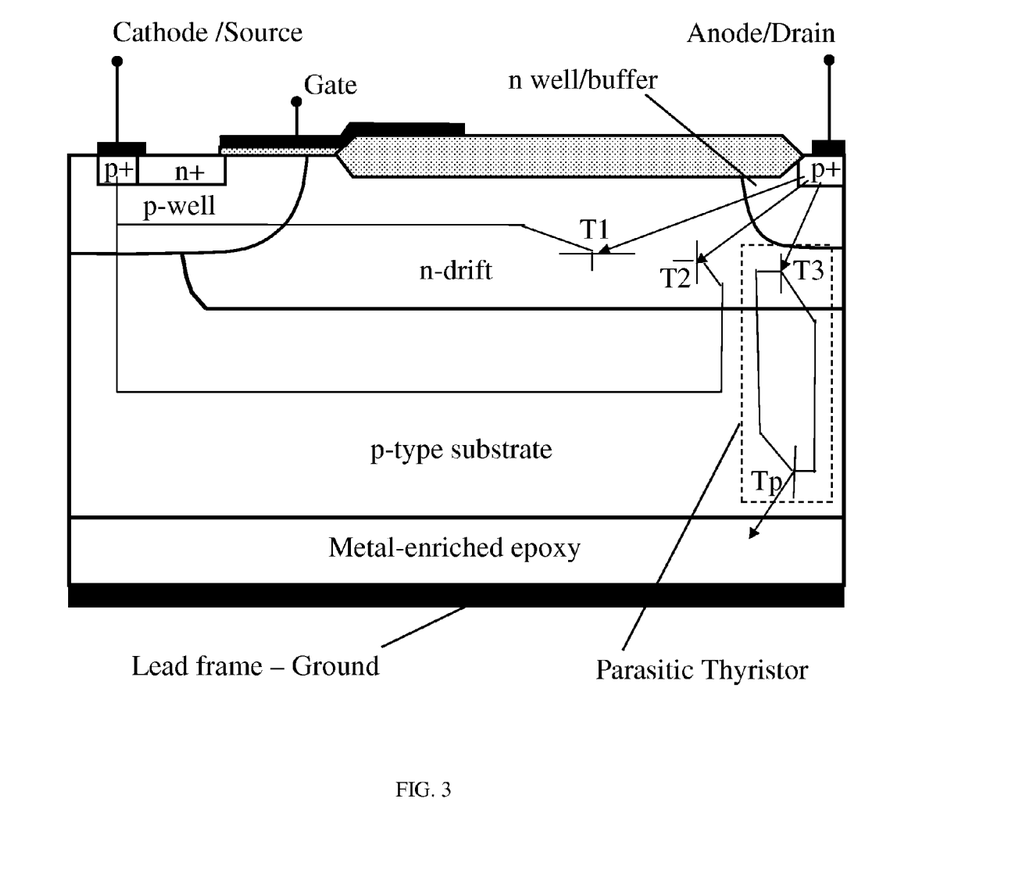
FIG. 3 shows a parasitic thyristor formed by a parasitic npn transistor together with the vertical pnp transistor T3 in the n-channel LIGBT.

As already mentioned, given that the p− substrate is lowly-doped, the contact between this metal-filled epoxy and the substrate may not be ohmic and may form a Schottky barrier. The metal (e.g., silver)-enriched epoxy may then act as a source of electrons (in a similar way to an n type layer) becoming the emitter of a parasitic npn transistor formed between the metal (silver)-filled epoxy (as emitter), the lowly-doped substrate region (as base) and the drift region and/or n-well buffer region (as collector). This parasitic npn transistor together with the vertical pnp transistor T3 form a parasitic thyristor as shown in FIG. 3. It is therefore very preferable that this thyristor is inhibited at all times, since as already mentioned before, its operation could slow down the device during turn-off and/or possibly lead to latch-up and/or ultimately thermal failure.

Figure 4:
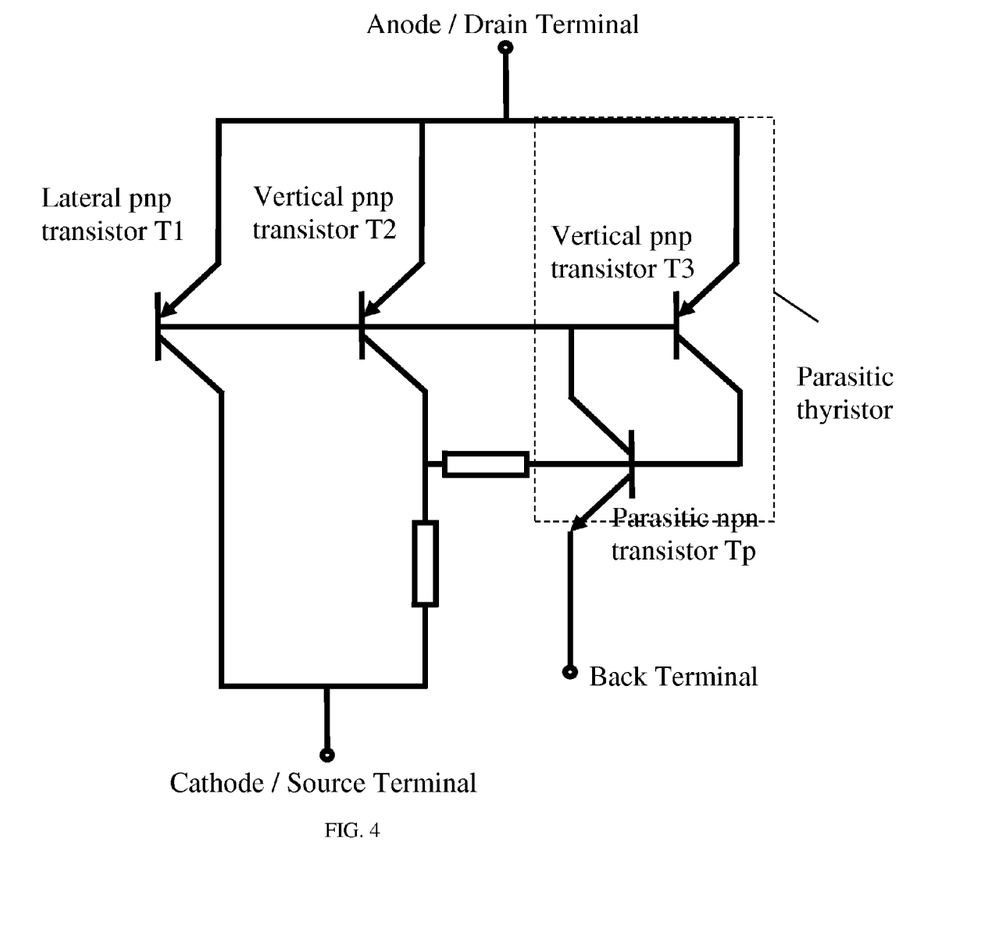
FIG. 4 shows an equivalent electrical connection diagram of the n-channel LIGBT, showing the relationships between the three pnp transistors, T1, T2 and T3 and the parasitic npn transistor, Tp.

FIG. 4 presents schematically an equivalent electrical connection diagram, showing the relationships between the three pnp transistors, T1, T2 and T3 and the parasitic npn transistor, Tp. T3 and Tp form a parasitic thyristor characterised by a positive feedback (base and collector terminals are connected to each-other reinforcing the current loop). Furthermore, all the three pnp transistors share the same emitter and base, being respectively the p+ region connected to the anode/drain terminal and the n-well buffer region and/or n-drift region. However the collector of each pnp transistor relates to a different region of the LIGBT: the collector of the lateral pnp transistor, T1, is formed by the p-well region, connected to the cathode/source terminal via the p+ short region. The collector of T2 is formed by the lowly-doped p-type substrate, and is dominated by the region of that substrate which is closer to the p-well region, connected to the cathode/source terminal via the p+ short region. The collector of T3 is also formed by the p-type substrate, however it is dominated by the region of that substrate lying further from the p-well region. This region of the substrate is connected to the back terminal of the LIGBT via the metal-filled epoxy and through the Schottky contact. Effectively the collector terminal is connected to the base of the parasitic npn transistor Tp.

Figure 5:
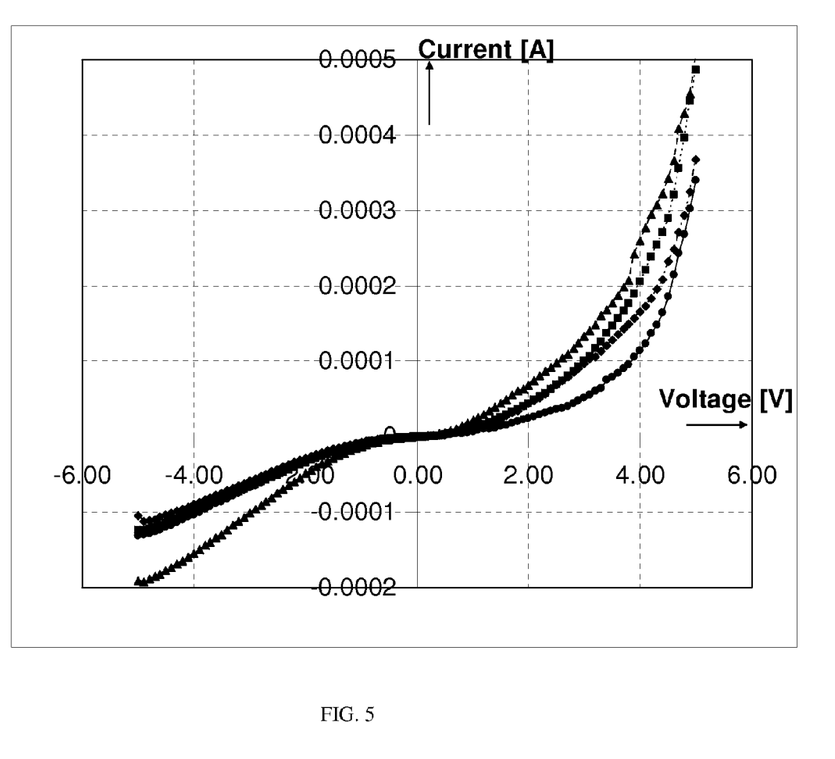
FIG. 5 shows I-V characteristics of a Schottky contact for different wafers processed in the same conditions.

The Schottky contact is a non linear contact and its barrier height varies from wafer to wafer, from lot to lot, and from one epoxy to another. It is a parasitic contact and its characteristics are often unpredictable. FIG. 5 shows the I-V characteristics of this contact for different wafers processed in the same conditions. It can be clearly seen that the contact can vary a lot from one chip made in one wafer to another made in a different wafer. The presence of this non-linear contact in the LIGBT can lead to additional switching losses via a parasitic thyristor, and/or can even lead to latch-up (and sometimes eventually thermal failure).

Furthermore the presence of the vertical pnp transistor T3 may be beneficial to the trade-off between the on-state and switching losses. Its gain should preferably be adjusted so that this trade-off is favourable for a particular application. Nevertheless, in principle and generally, the thinner the p− substrate region, the thinner the collector region of T3 and the faster the turn-off and the lower the losses. However thinning down T3 also means a shorter base for the parasitic npn transistor and hence a more active thyristor.

It is therefore an advantage of an embodiment to suppress or drastically minimise the effect of this non-linear contact and hence suppress the action of the parasitic thyristor in all operation modes.

In a first arrangement, a lateral insulated gate bipolar transistor that comprises a lowly-doped substrate of first conductivity type, a drift region of second conductivity type, placed above the substrate, a charge injection region of first conductivity type, preferably located within a buffer region of second conductivity type, adjacent to the drift region, a parasitic thyristor, having one of the first type carrier injection regions formed by said charge injection region and the second type carrier injection region formed by a metal enriched epoxy attached to the lowly-doped substrate and further attached to a package, whereby the injection from said second type carrier injection region is significantly lowered or effectively suppressed, such that the thyristor is inactive in all operation modes.

In a second arrangement, a Lateral Insulated Gate Bipolar Transistor (LIGBT) comprising at least one pnp transistor, said at least one of the pnp transistors being connected to a parasitic npn transistor in a thyristor configuration, said parasitic npn transistor having the emitter/base junction formed by a Schottky contact between a metal-enriched epoxy used as die attach for the package and a lowly-doped p-type substrate wherein the current gain of the parasitic npn transistor is considerably lowered or completely annulled such that said thyristor is inactive in each and all operation modes preferably including extreme conditions of operation. The said at least one pnp transistor has the emitter formed by the p+ region connected to the anode/drain terminal, the base formed by the n-drift region and/or n-well region, if present, and the collector region formed by the p− lowly-doped substrate. The parasitic npn transistor has the emitter formed by said metal-enriched epoxy, the base formed by the lowly-doped p-type substrate and the collector formed by the n-drift region and/or n-well region if present.

Preferably the metal used to enrich the epoxy for thermal/electrical conduction is silver. Examples of such silver enriched epoxies are Epotek H20E, Ablebond 2600AT and 84-1 LMI and their thermal conductivities are 29 W/mK, 20 W/mK and 2.4 W/mK respectively.

Preferably, a p+ highly-doped layer is added at the back surface of said lowly-doped substrate adjacent to said metal enriched epoxy, as shown in FIG. 6. This layer may have a double role: (i) it facilitates tunnelling of holes from the lowly-doped p− type substrate to the metal-enriched epoxy and thus suppresses the Schottky contact and (ii) it acts as a barrier to electrons from reaching the n-drift region, where they can act as a base current for the said vertical pnp transistor. Both these features alone or in combination may result in considerably lowering the gain of the parasitic npn transistor.

Preferably, the said p+ highly-doped layer is added at wafer level, after the top regions and the formation of metallization layers at the top surface are carried out, and before the die is diced and attached to the package with the help of the metal-filled epoxy.

Preferably, the said p+ highly-doped layer is added after the wafer is thinned down (by grinding and/or chemical-mechanical polishing). The thinning down may: (i) help to reduce the thermal path from the top regions to the back surface and thus allows favourable heat dissipation; (ii) allow higher turn-off speed and lower switching losses as there is a less resistive access to the plasma stored at the top of the highly-doped layer or lowly-doped substrate region; and/or (iii) help confine the plasma in a smaller volume, further reducing the turn-off time and switching losses.

Preferably the thinning down of the substrate leads to a total thickness of the p-type substrate between 50 to 300 micrometers, and from a mechanical/electrical/thermal trade-off perspective, between 100 to 250 micrometers.

Preferably, the said p+ highly-doped layer is of the order of hundreds of nanometers to a few micrometers in thickness.

Preferably the said p+ highly-doped layer is one or more orders of magnitude more highly-doped than the p− layer substrate.

Preferably the said p+ highly-doped layer has a peak doping concentration higher than $1 \times 10^{16}$ cm$^{-3}$.

Figure 8:
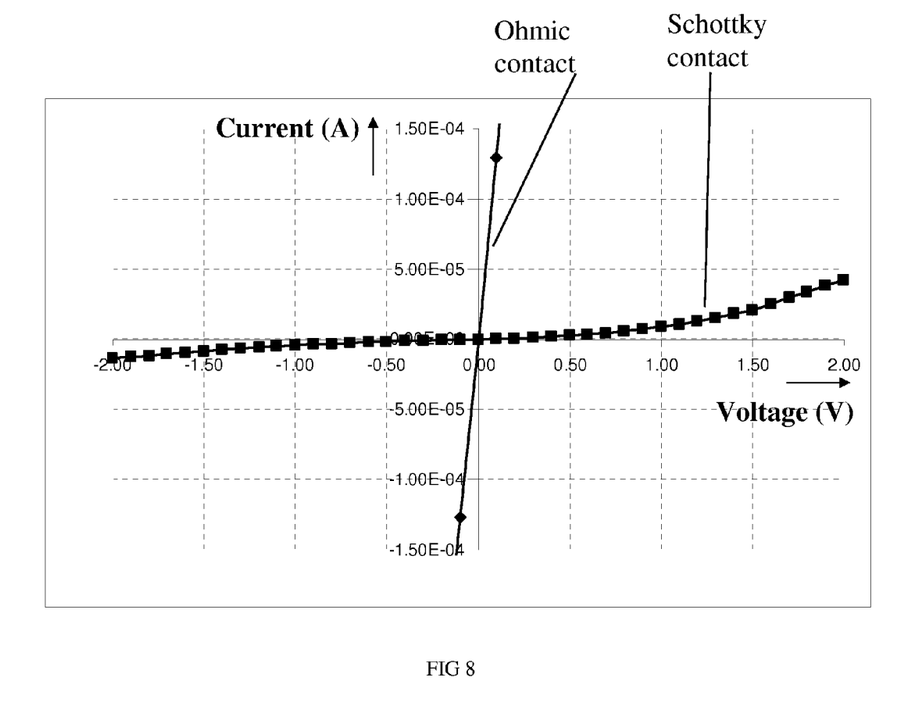
FIG. 8 shows I-V characteristics for a Schottky contact and for an ohmic contact.

An extra metallization layer may be added after the p+ layer is formed, at the wafer level stage (before dicing and attaching the die to the package), as shown in FIG. 7. This metal layer can further improve the non-linear contact leading to a pure ohmic contact (linear and reversible I-V characteristics as shown in FIG. 8). FIG. 8 shows a comparison between I-V characteristics for a Schottky contact (formed between the epoxy and the lowly-doped p-type substrate) and an ohmic contact (when a p+ and a metal layer are added between the lowly-doped p-type substrate and the epoxy). The metal layer can be a CMOS-compatible metal such as Aluminium, Tungsten, Titanium or alloys based on one of these or other CMOS-compatible metals.

Alternatively, a thin insulating layer such as a low temperature oxide (LTO), a nitride layer or a combination of a nitride and oxide layer is deposited onto the back surface of the lowly-doped substrate, adjacent to said metal-filled epoxy, as shown in FIG. 9. This layer preferably completely suppresses the injection of electrons from the metal-filled epoxy and therefore preferably completely removes the existence of the npn parasitic transistor and the existence of the thyristor. This method may also remove the existence of vertical pnp transistor T3, as the thin insulating layer may remove the electrical connection to its collector. Therefore this embodiment may have a less favourable trade-off between on-state and switching performance than that using the p+ layer or the p+ layer and the subsequent metallization layer.

Preferably, the insulating layer is deposited (via chemical vapour deposition techniques) at wafer level, after the top regions and the formation of metallization layers at the top surface are carried out and before the die is diced and attached to the package with the help of the metal-filled epoxy.

Preferably, the insulating layer is very thin (below 1 micrometer) so that it does not add a considerable thermal resistance.

Preferably the current gain (e.g., $h_{fe}$) of the parasitic npn transistor, $\alpha_p$ is less than 0.1 and even more preferably below 0.01. The sum of the current gain of the parasitic npn transistor, $\alpha_p$, and the current gain of vertical pnp transistor T3 should be less than unity at all times, to avoid the break-over of the parasitic thyristor.

Preferably the Lateral Insulated Gate Bipolar Transistor (LIGBT) of any embodiment is used in power ICs monolithically integrated with other devices or CMOS circuits.

Preferably the Lateral Insulated Gate Bipolar Transistor (LIGBT) of any embodiment is used in conjunction with bulk CMOS technology or Junction Isolation technology where the n– drift region is formed inside a p-substrate. The single RESURF, double RESURF or multiple RESURF concepts may be used to increase the breakdown ability of the device.

Preferably, in any embodiment, the thickness of the drift region is greater than 1 μm and typically between 3 to 20 μm while the effective thickness through which the current flows, which includes the drift region thickness and part of the p-substrate thickness below it, is greater than 20 μm Although the present specification mainly discusses a LIGBT (lateral Insulated Gate Bipolar Transistor), the principles of the present invention are also applicable to other lateral devices such as power/high voltage diodes (PIN diodes or Schottky diodes), power (or high voltage) bipolar transistors or thyristors.

No doubt many other effective alternatives will occur to the skilled person. It will be understood that the invention is not limited to the described embodiments and encompasses modifications apparent to those skilled in the art lying within the spirit and scope of the claims appended hereto.

The invention claimed is:

1. A method of forming an LIGBT, the LIGBT comprising:
    a substrate region of first conductivity type and peak dopant concentration less than about $1 \times 10^{17}/cm^3$;
    a lateral drift region of a second, opposite conductivity type adjacent the substrate region and electrically coupled to said substrate region;
    a charge injection region of the first conductivity type to inject charge toward said lateral drift region;
    a gate to control flow of said charge in said lateral drift region; and
    metal enriched adhesive below said substrate region,
    the method comprising:
    forming an intermediate layer below said substrate region to substantially suppress charge injection into said substrate region from said metal enriched adhesive.

2. The method of claim 1, wherein said suppression is of charge injection into said substrate region from a Schottky barrier between said substrate region and said metal enriched adhesive.

3. The method of claim 1, wherein said forming an intermediate layer comprises forming as said intermediate layer a semiconductor layer of the first conductivity type and having higher peak dopant concentration than said substrate region.

4. The method of claim 3, further comprising forming a metallic layer between said semiconductor layer and said adhesive.

5. The method of claim 3, comprising adding said semiconductor layer after fabricating contact regions and metallization layers at the top surface of the LIGBT.

6. The method of claim 3, comprising forming the LIGBT in a wafer and adding said semiconductor layer after thinning the wafer.

7. The method of claim 3, comprising, in the following order, fabricating the semiconductor layer, and fabricating a metallization layer attached to the semiconductor layer.

8. The LIGBT of claim 7, wherein the thickness of the drift region is greater than 1 μm and preferably between 3 to 20 μm.

9. The method of 8, comprising depositing as said intermediate layer an insulating layer such as an oxide layer, a nitride layer and/or a combination of a nitride and oxide, on to a back surface of the substrate region and adjacent to said metal-filled epoxy, wherein the insulating layer is deposited after contact regions and metallization layers at the top surface of the LIGBT are fabricated.

10. The method of claim 8, comprising forming at the back surface of said substrate region adjacent to said metal enriched epoxy a p type layer having higher peak dopant concentration than said substrate region, and comprising adding said p type layer having higher peak dopant concentration after contact regions and metallization layers at the top surface of the LIGBT are fabricated.

11. The method of claim 8, comprising forming at the back surface of said substrate region adjacent to said metal enriched epoxy a p type layer having higher peak dopant concentration than said substrate region, and comprising forming the LIGBT in a wafer and adding said p type layer having higher peak dopant concentration after thinning the wafer.

12. A method of claim 8, comprising forming at the back surface of said substrate region adjacent to said metal enriched epoxy a p type layer having higher peak dopant concentration than said substrate region, and comprising fabricating, in the following order, the p type layer having higher peak dopant concentration than said substrate region, and a metallization layer attached to the p type layer having higher peak dopant concentration.

13. The LIGBT according to claim 7 in an integrated circuit (IC), the IC comprising at least one other, preferably CMOS-based, device.

14. The method of claim 1, wherein said forming an intermediate layer comprises forming as said intermediate layer a metallic layer between said substrate region and said adhesive.

15. The method of claim 1, wherein said forming an intermediate layer comprises forming as said intermediate layer an electrically insulating layer.

16. The method of claim 15, comprising depositing the insulating layer after fabricating contact regions and metallization layers at the top surface of the LIGBT.

17. An LIGBT comprising:
a substrate region of first conductivity type and peak dopant concentration less than about $1\times10^{17}/cm^3$;
a lateral drift region of a second, opposite conductivity type adjacent the substrate region and electrically coupled to said substrate region;
a charge injection region of the first conductivity type to inject charge toward said lateral drift region;
a gate to control flow of said charge in said lateral drift region;
metal enriched adhesive below said substrate region; and
an intermediate layer below said substrate region to substantially suppress charge injection into said substrate region from said metal enriched adhesive.

18. The LIGBT of claim 17, wherein said suppression is of charge injection into said substrate region from a Schottky barrier between said substrate region and said metal enriched adhesive.

19. The LIGBT of claim 17, wherein said intermediate layer comprises a semiconductor layer of the first conductivity type and having higher peak dopant concentration than said substrate region.

20. The LIGBT of claim 19, further comprising a metallic layer between said semiconductor layer and said adhesive.

21. The LIGBT of claim 19, wherein the semiconductor layer is between 500 nanometers and 5 micrometers in thickness.

22. The LIGBT of claim 19, wherein the semiconductor layer is at least 100 times, more preferably at least 1000 times, more highly-doped than the substrate region.

23. The LIGBT of claim 19, wherein the semiconductor layer has a peak doping concentration higher than $1\times10^{16}$ $cm^{-3}$, preferably higher than $1\times10^{17}$ $cm^{-3}$.

24. The LIGBT of claim 17, wherein said intermediate layer comprises a metallic layer between said substrate region and said adhesive.

25. The LIGBT of claim 17, wherein said intermediate layer comprises an electrically insulating layer.

26. The LIGBT of claim 25, wherein said insulating layer comprises an oxide layer, a nitride layer and/or a combination of nitride and oxide on a back surface of the substrate region and adjacent to said adhesive.

27. The LIGBT of claim 25, wherein the insulating layer has thickness less than 1 micrometer.

28. The LIGBT of claim 17, comprising a pnp transistor having an emitter comprising the charge injection region connected to an anode terminal, a base of said pnp transistor comprising the drift region, and a collector region comprising the substrate region.

29. The LIGBT of claim 17, comprising a pnp transistor having an emitter comprising the charge injection region connected to an anode terminal, a base of said pnp transistor comprising a well region, and a collector region comprising the substrate region, wherein said well region is preferably a buffer region of second conductivity type adjacent to the drift region, said charge injection region located within said buffer region.

30. The LIGBT of claim 17, wherein the substrate region has a thickness of between 50 to 300 micrometers.

31. The LIGBT of claim 17, wherein the thickness of the drift region is greater than 1 µm and preferably between 3 to 20 µm.

32. The LIGBT according to claim 17 in an integrated circuit (IC), the IC further comprising at least one other device.

33. A method of forming an LIGBT, the LIGBT comprising:
a substrate region of first conductivity type and peak dopant concentration less than about $1\times10^{17}/cm^3$;
a lateral drift region of a second, opposite conductivity type above the substrate region;
a charge injection region of the first conductivity type; and
metal enriched epoxy,
whereby a parasitic thyristor having a carrier injection region is formable by said charge injection region and a carrier injection region of the second conductivity type formed by said metal enriched epoxy,
the method comprising providing an intermediate layer between said substrate region and said second type charge injection region to reduce charge injection from said second type carrier injection region into said substrate region such that the loop gain of the thyristor is less than unity in at least one predetermined operation mode.

34. A lateral insulated gate bipolar transistor (LIGBT) comprising:
a substrate region of first conductivity type and peak dopant concentration less than about $1\times10^{17}/cm^3$;
a lateral drift region of a second, opposite conductivity type above the substrate region;
a charge injection region of the first conductivity type;
metal enriched epoxy; and
a parasitic thyristor having a carrier injection region formable by said charge injection region and a carrier injection region of the second conductivity type formed by said metal enriched epoxy, wherein said substrate region and carrier injection region are configured to reduce charge injection from said second type carrier injection region into said substrate region such that the loop gain of the thyristor is less than unity in at least one predetermined operation mode.

35. LIGBT of claim 34, wherein said first conductivity type is p type, the LIGBT comprising:
at least one pnp transistor and a parasitic npn transistor, a said pnp transistor connected to the parasitic npn transistor in a thyristor configuration to form said parasitic thyristor;
a die attach formed by said metal enriched epoxy; and
said parasitic npn transistor having an emitter-base junction formed by a Schottky contact between the metal-enriched epoxy die attach and the p-type substrate region,
wherein the current gain of the parasitic npn transistor is such that said loop gain of the thyristor is less than unity in at least one predetermined operation mode of the LIGBT.

36. The LIGBT of claim 35, wherein said pnp transistor has an emitter comprising a p type region connected to an anode terminal, a base of said pnp transistor comprising the n type drift region, and a collector region comprising the p type substrate region of peak dopant concentration less than about $1\times10^{17}/cm^3$.

37. The LIGBT of claim 35, wherein said pnp transistor has an emitter comprising a p region connected to an anode terminal, a base of said pnp transistor comprising a well region, and a collector region comprising the substrate region of peak dopant concentration less than about $1\times10^{17}/cm^3$, wherein said well region is preferably a buffer region of second conductivity type adjacent to the drift region, said charge injection region of the first conductivity type located within said buffer region.

38. The LIGBT of claim 35, wherein the parasitic npn transistor has an emitter comprising said metal-enriched epoxy die attach, a base comprising the p type substrate region of peak dopant concentration less than about $1\times10^{17}/cm^3$ and a collector comprising the n type drift region.

39. The LIGBT of claim 35, wherein the parasitic npn transistor has an emitter comprising said metal-enriched epoxy die attach, a base comprising the p type substrate region of peak dopant concentration less than about $1\times10^{17}/cm^3$ and a collector comprising an n type well region, wherein said well region is preferably a buffer region of second conductivity type adjacent to the drift region, said charge injection region of the first conductivity type located within said buffer region.

40. The LIGBT of claim 35, wherein the sum of the current gain of the parasitic npn transistor, $\alpha_p$, and the current gain $\alpha_n$ of the said pnp transistor is less than unity in all operational modes of the LIGBT.

41. The LIGBT of claim 34, comprising at the back surface of said substrate region adjacent to said metal enriched epoxy a p type layer having higher peak dopant concentration than said substrate region.

42. The LIGBT of claim 41, wherein the p type layer having higher peak dopant concentration than said substrate region is between 500 nanometers and 5 micrometers in thickness.

43. The LIGBT of claim 41, wherein the p type layer having higher peak dopant concentration than said substrate region is at least 100 times, preferably at least 1000 times, more highly-doped than the substrate region said higher dopant concentration preferably higher than $1\times10^{16}$ cm$^{-3}$.

44. The LIGBT of claim 41, comprising a metallization layer attached to the p type layer having higher peak dopant concentration than said substrate region.

45. The LIGBT of claim 34, comprising an insulating layer such as an oxide layer, a nitride layer or a combination of a nitride and oxide, on a back surface of the substrate region and adjacent to said epoxy.

46. The LIGBT of claim 45, wherein the insulating layer has thickness less than 1 micrometer.

47. The LIGBT of claim 34, wherein the current gain of the parasitic npn transistor, $\alpha_p$ is less than 0.1 and even more preferably below 0.01.

48. An LIGBT comprising:
   a substrate region of first conductivity type and peak dopant concentration less than about $1\times10^{17}/cm^3$;
   a lateral drift region of a second, opposite conductivity type above the substrate region, adjacent said substrate region and electrically connected to said substrate region;
   a charge injection region of the first conductivity type electrically coupled to said drift region;
   a first electrical connection to said charge injection region;
   a second electrical connection to said drift region to remove charge from said drift region;
   a gate connection between said first and second electrical connections;
   an intermediate layer beneath said substrate region;
   a metal-enriched adhesive layer beneath said intermediate layer; and
   a reference voltage connection beneath said metal-enriched adhesive layer, wherein
   said intermediate layer comprises one or more of:
   an electrically insulating layer;
   a semiconductor layer of said first conductivity type having a peak dopant concentration greater than a peak dopant concentration of said substrate region; and
   a layer of metal having a work function relative to a work function of said substrate region to provide a substantially nonrectifying contact between said substrate region and said layer of metal.

* * * * *